United States Patent
Watanabe et al.

(10) Patent No.: US 9,484,276 B2
(45) Date of Patent: Nov. 1, 2016

(54) SEMICONDUCTOR MOUNTING DEVICE AND METHOD FOR MANUFACTURING SEMICONDUCTOR MOUNTING DEVICE

(71) Applicant: IBIDEN CO., LTD., Ogaki (JP)

(72) Inventors: Hiroyuki Watanabe, Ogaki (JP); Masahiro Kaneko, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/620,451

(22) Filed: Feb. 12, 2015

(65) Prior Publication Data

US 2015/0162255 A1 Jun. 11, 2015

Related U.S. Application Data

(60) Continuation of application No. 14/141,927, filed on Dec. 27, 2013, now Pat. No. 8,999,753, which is a division of application No. 13/302,572, filed on Nov. 22, 2011, now Pat. No. 8,643,154.

(60) Provisional application No. 61/437,974, filed on Jan. 31, 2011.

(51) Int. Cl.
*H01L 23/13* (2006.01)
*H01L 23/12* (2006.01)
(Continued)

(52) U.S. Cl.
CPC ............ *H01L 23/13* (2013.01); *H01L 21/486* (2013.01); *H01L 21/76898* (2013.01); *H01L 23/49816* (2013.01); *H01L 23/49822* (2013.01); *H01L 23/49827* (2013.01); *H01L 24/11* (2013.01); *H01L 24/14* (2013.01); *H01L 24/17* (2013.01); *H01L 23/3128* (2013.01); *H01L 2224/11005* (2013.01); *H01L 2224/16225* (2013.01);

(Continued)

(58) Field of Classification Search
CPC ............... H01L 23/13; H01L 21/486; H01L 21/76898; H01L 23/49816; H01L 23/49822; H01L 23/49827; H01L 24/14; H01L 24/11; H01L 24/17

See application file for complete search history.

(56) References Cited

U.S. PATENT DOCUMENTS 6,022,757 A * 2/2000 Andoh .................. H01L 23/147
257/E21.508
6,087,597 A 7/2000 Shimada et al.
(Continued)

FOREIGN PATENT DOCUMENTS

JP 2001-223315 8/2001
JP 2001-284488 A 10/2001
JP 2004-4428 A 1/2004

*Primary Examiner* — Mohsen Ahmadi
*Assistant Examiner* — Gustavo Ramallo
(74) *Attorney, Agent, or Firm* — Oblon, McClelland, Maier & Neustadt, L.L.P.

(57) ABSTRACT

A semiconductor mounting device including a first substrate having insulation layers, conductor layers formed on the insulation layers, and via conductors connecting the conductor layers, a second substrate having insulation layers and conductor layers formed on the insulation layers of the second substrate, first bumps connecting the first substrate and the second substrate and formed on an outermost conductor layer of the first substrate formed on an outermost insulation layer of the first substrate, and second bumps positioned to mount a semiconductor element to the second substrate and formed on an outermost conductor layer of the second substrate formed on an outermost insulation layer of the second substrate. The second substrate has a thickness which is greater than a thickness of the first substrate.

20 Claims, 15 Drawing Sheets

(51) Int. Cl.
   *H01L 23/498*  (2006.01)
   *H01L 21/768*  (2006.01)
   *H01L 23/00*   (2006.01)
   *H01L 21/48*   (2006.01)
   *H01L 23/31*   (2006.01)

(52) U.S. Cl.
   CPC ........... *H01L2224/16227* (2013.01); *H01L 2224/16237* (2013.01); *H01L 2224/32225* (2013.01); *H01L 2224/73204* (2013.01); *H01L 2924/12042* (2013.01); *H01L 2924/1517* (2013.01); *H01L 2924/15311* (2013.01)

(56) References Cited

U.S. PATENT DOCUMENTS

| | | | |
|---|---|---|---|
| 6,239,485 B1 * | 5/2001 | Peters | H01L 23/49822 257/691 |
| 6,338,207 B1 | 1/2002 | Chang | |
| 6,388,207 B1 | 5/2002 | Figueroa et al. | |
| 6,650,014 B2 * | 11/2003 | Kariyazaki | H01L 23/50 257/693 |
| 6,706,975 B2 | 3/2004 | Sumi et al. | |
| 6,979,890 B2 | 12/2005 | Kambe et al. | |
| 7,038,142 B2 * | 5/2006 | Abe | H01L 23/142 174/255 |
| RE40,947 E | 10/2009 | Asai et al. | |
| 7,693,382 B2 | 4/2010 | Asai | |
| 7,847,318 B2 | 12/2010 | Hirose et al. | |
| 7,989,707 B2 | 8/2011 | Yamano et al. | |
| 8,035,218 B2 | 10/2011 | Guzek et al. | |
| 8,093,704 B2 | 1/2012 | Palmer et al. | |
| 8,304,664 B2 | 11/2012 | Kobayashi et al. | |
| 2003/0173676 A1 | 9/2003 | Horikawa | |
| 2005/0211465 A1 | 9/2005 | Sunohara et al. | |
| 2006/0261464 A1 | 11/2006 | Modi et al. | |
| 2007/0096327 A1 | 5/2007 | Kawamura et al. | |
| 2008/0023607 A1 | 1/2008 | Barker | |
| 2008/0223607 A1 | 9/2008 | Muramatsu et al. | |
| 2009/0038830 A1 | 2/2009 | Tanaka et al. | |
| 2009/0121341 A1 | 5/2009 | Oi et al. | |
| 2009/0242245 A1 | 10/2009 | Asano | |
| 2009/0321919 A1 | 12/2009 | Sugino et al. | |
| 2010/0108371 A1 | 5/2010 | Furutani et al. | |
| 2012/0133045 A1 | 5/2012 | Hayashi et al. | |
| 2012/0193780 A1 * | 8/2012 | Watanabe | H01L 23/49822 257/737 |
| 2012/0241202 A1 | 9/2012 | Vasoya | |
| 2012/0279059 A1 | 11/2012 | Roberts et al. | |
| 2013/0215586 A1 | 8/2013 | Furusawa et al. | |

\* cited by examiner

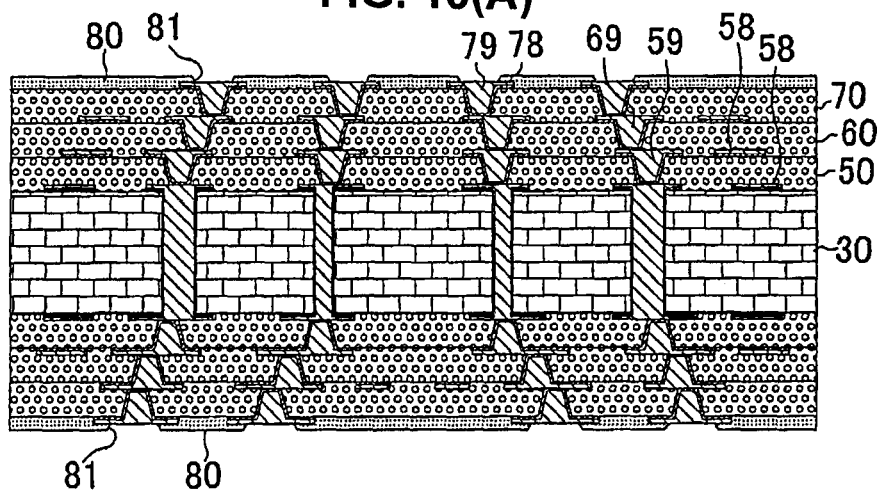
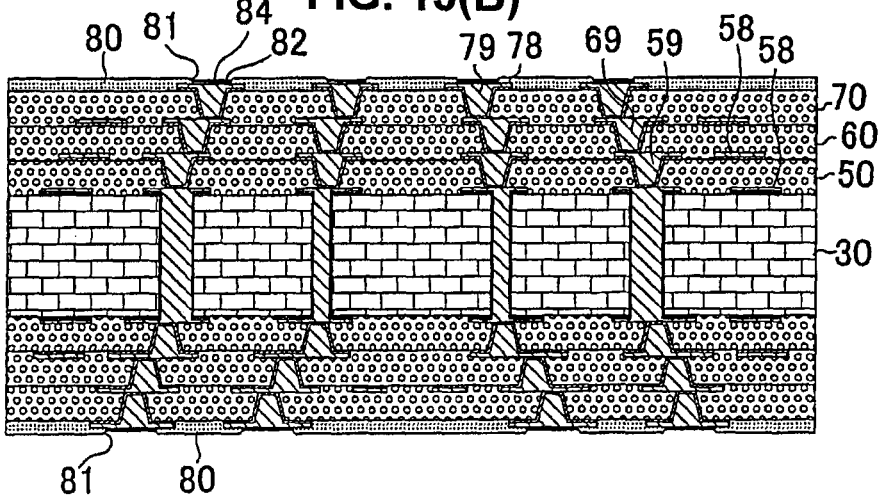
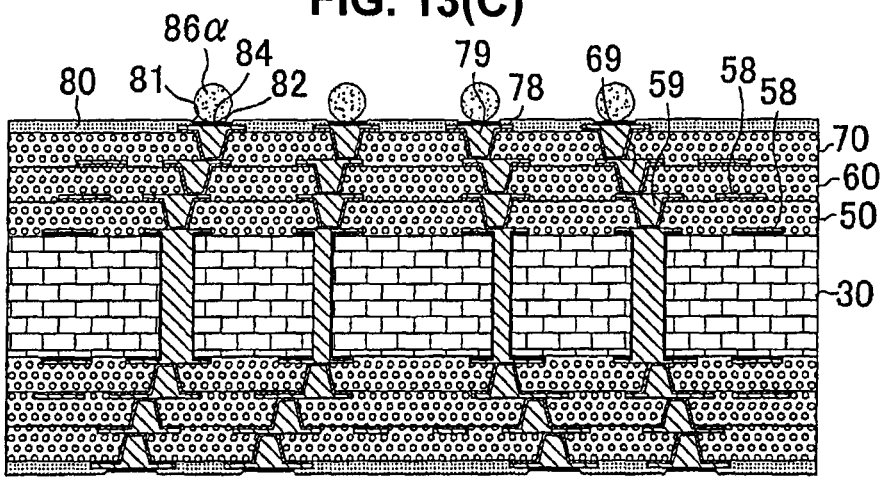

SEMICONDUCTOR MOUNTING DEVICE AND METHOD FOR MANUFACTURING SEMICONDUCTOR MOUNTING DEVICE

CROSS-REFERENCE TO RELATED APPLICATIONS

The present application is a continuation of and claims the benefit of priority to U.S. application Ser. No. 14/141,927, filed Dec. 27, 2013, which is a divisional of and claims the benefit of priority to U.S. application Ser. No. 13/302,572, filed Nov. 22, 2011, which is based on and claims the benefits of priority to U.S. application Ser. No. 61/437,974, filed Jan. 31, 2011. The entire contents of these applications are incorporated herein by reference.

BACKGROUND OF THE INVENTION

1. Field of the Invention

The present invention relates to a semiconductor mounting device for mounting a semiconductor. The device is formed by placing a second printed wiring board on a first printed wiring board.

2. Discussion of the Background

As a mounting substrate for a CPU of a computer, a buildup substrate such as one described in Japanese Laid-Open Patent Publication 2001-223315 is used where interlayer insulation layers and conductive circuits are laminated to be built up on a core substrate. The contents of this publication are incorporated herein by reference in their entirety.

SUMMARY OF THE INVENTION

According to one aspect of the present invention, a semiconductor mounting device includes a first substrate having first insulation layers, first conductor layers formed on the first insulation layers and via conductors connecting the first conductor layers, a second substrate having a core substrate, second conductor layers, through-hole conductors and buildup layers including second insulation layers and third conductor layers, first bumps connecting the first substrate and the second substrate and formed on the outermost first conductor layer of the first conductor layers formed on the outermost first insulation layer of the first insulation layers, and second bumps positioned to mount a semiconductor element to the second substrate and formed on the outermost third conductor layer of the third conductor layers formed on the outermost second insulation layer of the second insulation layers. The second substrate has a thickness which is greater than a thickness of the first substrate, the second conductor layers are formed on opposite surfaces of the core substrate, respectively, the through-hole conductors are formed in penetrating holes through the core substrate and connecting the second conductor layers to each other, and the buildup layers are formed on the surfaces of the core substrate and the second conductor layers, respectively.

According to another aspect of the present invention, a method for manufacturing a semiconductor mounting device includes forming first bumps on a first substrate, forming second bumps for mounting a semiconductor element on a surface of the second substrate, and connecting the first substrate and the second substrate via the first bumps. The first substrate has first insulation layers, first conductor layers formed on the first insulation layers and via conductors connecting the first conductor layers, the second substrate has a core substrate, second conductor layers, through-hole conductors and buildup layers including second insulation layers and third conductor layers, the first bumps are formed on the outermost first conductor layer of the first conductor layers formed on the outermost first insulation layer of the first insulation layers, the second bumps are formed on the outermost third conductor layer of the third conductor layers formed on the outermost second insulation layer of the second insulation layers, the second substrate has a thickness which is greater than a thickness of the first substrate, the second conductor layers are formed on opposite surfaces of the core substrate, respectively, the through-hole conductors are formed in penetrating holes through the core substrate and connecting the second conductor layers to each other, and the buildup layers are formed on the surfaces of the core substrate and the second conductor layers, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 13(A)-(C) are views showing steps of manufacturing a second substrate according to the embodiment;

DETAILED DESCRIPTION OF THE EMBODIMENTS

Figure 1:
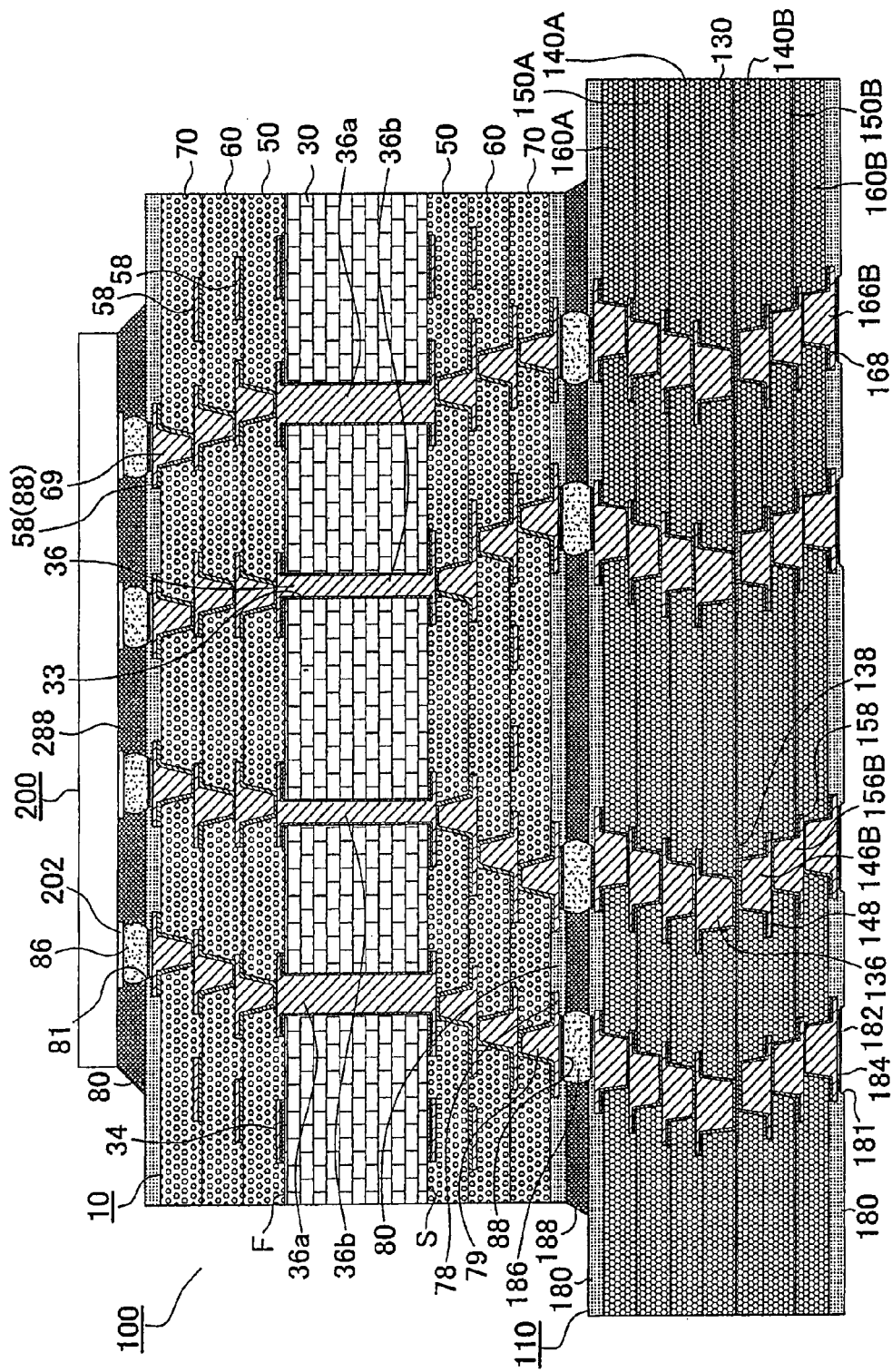
FIG. 1 is a cross-sectional view of a semiconductor device according to an embodiment of the present invention.

The embodiments will now be described with reference to the accompanying drawings, wherein like reference numerals designate corresponding or identical elements throughout the various drawings.

A semiconductor mounting device according to an embodiment of the present invention is described with reference to FIGS. 1 through 15. First, FIG. 1 shows a state (a semiconductor device) in which semiconductor element 200 is mounted on semiconductor mounting device 100. FIG. 15 is a view showing semiconductor mounting device 100 before semiconductor element 200 is mounted. Semiconductor mounting device 100 has first substrate 110 and second substrate 10 set on first substrate 110 via bumps 186. Resin filler 188 is filled between first substrate 110 and second substrate 10. Semiconductor element 200 is mounted on second substrate 10 via solder bumps 86. Resin filler 288 is filled between second substrate 10 and semiconductor element 200.

The thickness of first substrate 110 is set at (t1) (approximately 0.8 mm). The thickness of second substrate 10 is set at (t2) (approximately 1.0 mm). In the present embodiment, first substrate 110 and second substrate 10 are set to satisfy the relationship: 1<t2/t1<2. When thickness (t1) of first substrate 110 and thickness (t2) of second substrate 10 satisfy the above relationship, the entire thickness of mounting device 10 is suppressed from increasing while stress generated in bumps 186 during the process of mounting semiconductor element 200 is mitigated effectively.

First Substrate

Figure 2:
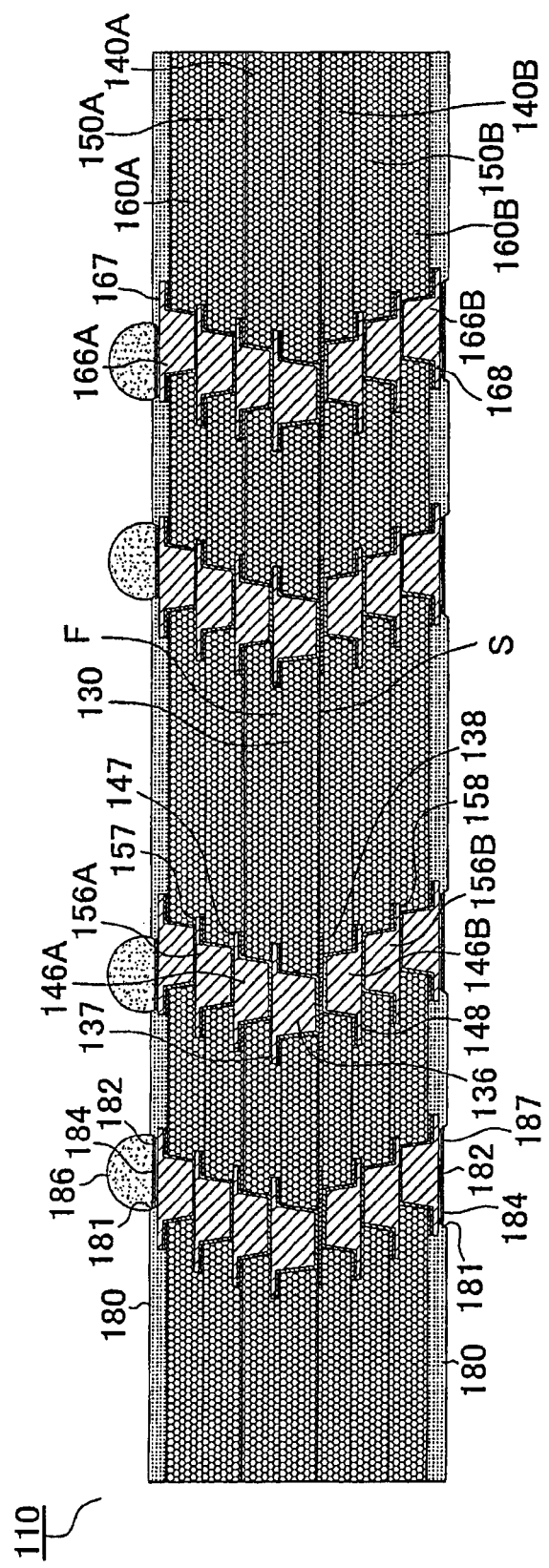
FIG. 2 is a cross-sectional view of a first substrate according to the embodiment.

FIG. 2 shows a cross-sectional view of first substrate 110. In substantially the center of a thickness direction, first substrate 110 has first insulation layer 130 which has first surface (F) and second surface (S). First insulation layer (140A) having first conductors 147 is formed on first surface (F) of insulation layer 130. On first insulation layer (140A), first insulation layer (150A) having first conductors 157 and first insulation layer (160A) having first conductors 167 are formed in that order. Meanwhile, first insulation layer (140B) having first conductors 148 is formed on second surface (S) of insulation layer 130. On first insulation layer (140B), first insulation layer (150B) having first conductors 158 and first insulation layer (160B) having first conductors 168 are formed in that order.

Penetrating holes are formed in their respective first insulation layers. Via conductors (136, 146A, 146B, 156A, 156B, 166A, 166B) are formed in their respective penetrating holes. Through via conductors (136, 146A, 146B, 156A, 156B, 166A, 166B), first conductors positioned in different layers are electrically connected to each other.

On outermost insulation layers (160A, 160B), solder-resist layers 180 having openings 181 are formed. Solder bumps 186 for connection with the above-described second substrate 10 are formed in openings 181 of solder-resist layer 180 on insulation layer (160A). Pads that include first conductors 168 exposed through the openings are formed in openings 181 of solder-resist layer 180 on insulation layer (160B). In addition, via conductors (136, 146A, 146B, 156A, 156B, 166A, 166B) are stacked in a columnar structure. Here, "a columnar structure" indicates a state in which a pair of via conductors, which are adjacent in a thickness direction, are in contact with each other. Accordingly, the distance between conductors in a thickness direction is shortened and wiring resistance decreases. As a result, loss of power supply voltage and signals is suppressed.

Figure 3:
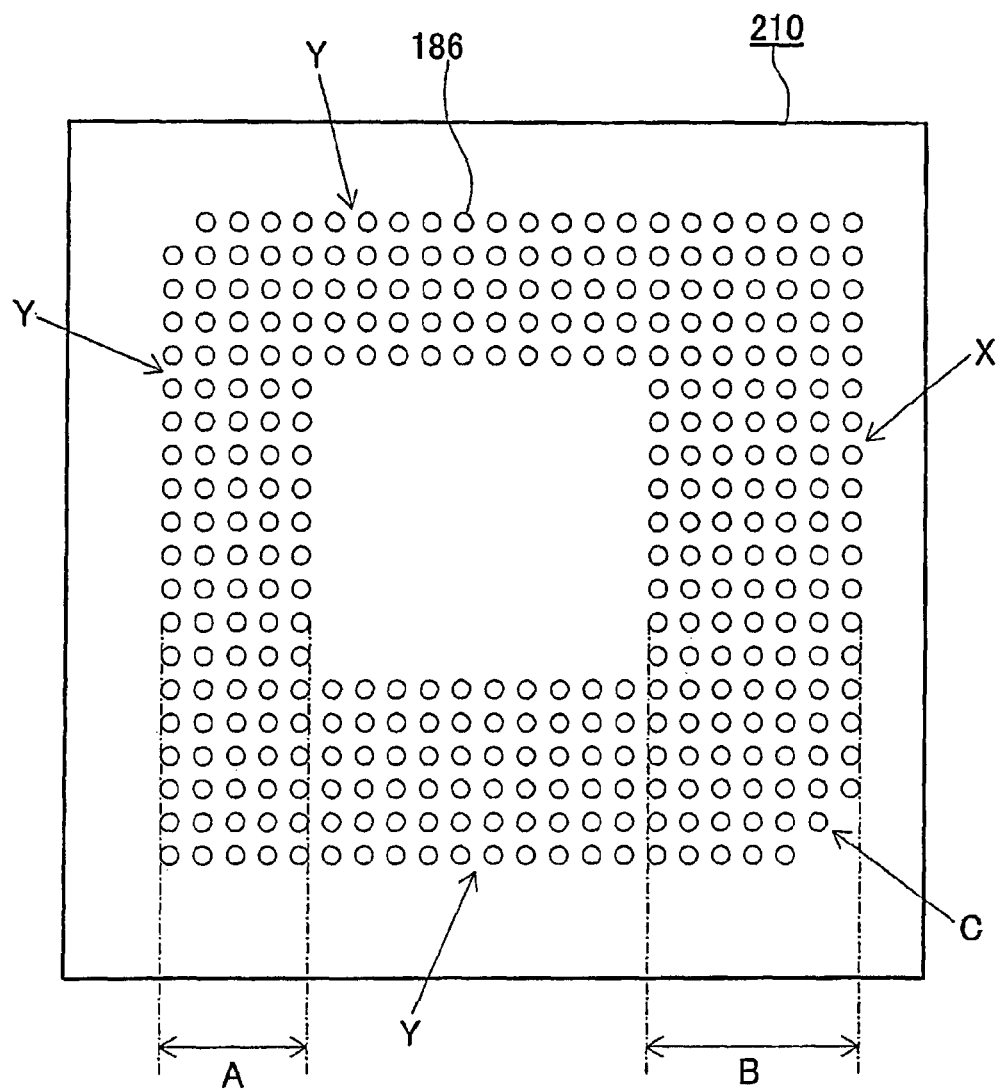
FIG. 3 is a plan view of a first substrate according to the embodiment.

FIG. 3 is a plan view of first substrate 110. As shown in the drawing, solder bumps 186 formed on first substrate 110 are laid out in a peripheral array. Among the four sides that form layout regions of bumps 186, the width of layout region (X) along a randomly selected side is greater than that of layout regions (Y) along the remaining three sides. In addition, among the layout regions of bumps 186, bumps that form at least one corner (C) are arranged along an oblique line. During the connection process of first substrate 110, corner (C) where bumps are arranged along an oblique line is used as a landmark for both substrates (10, 110) to be aligned with each other.

Next, by referring to FIGS. 4 through 7, a method is described for manufacturing second substrate 10 described above with reference to FIG. 2.

Figure 4A:
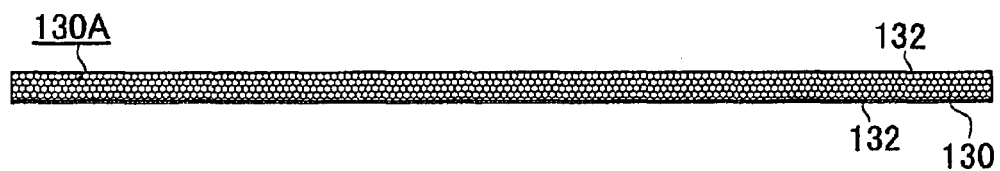
FIGS. 4(A)-(C) are views showing steps of manufacturing a first substrate according to the embodiment.

(1) Copper-clad laminate 130A, made by laminating approximately 10 μm copper foil 132 on both surfaces of insulation layer 130, which is either glass-epoxy resin or BT (bismaleimide triazine) resin with an approximate thickness of 60 μm, is used as a starting material (FIG. 4(A)).

Figure 4B:
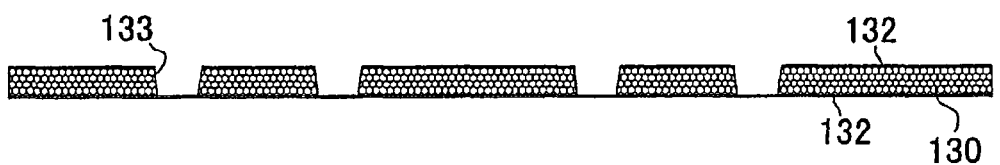
Figure 4C:
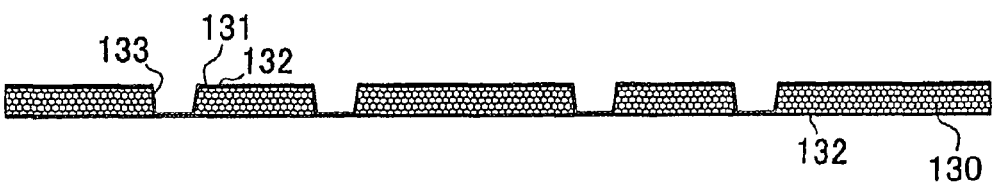

(2) After forming via openings 133 that reach copper foil 132 on the lower-surface side using a laser (FIG. 4(B)), electroless plated film 131 is formed on the entire surface by performing electroless plating (FIG. 4(C)).

Figure 5A:
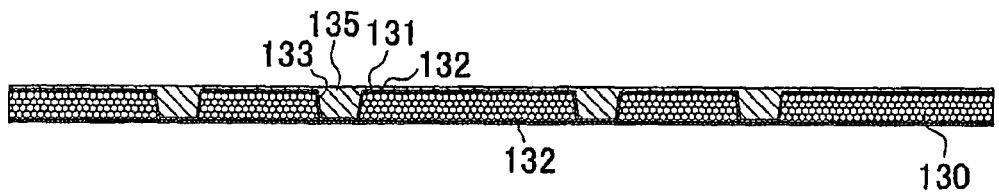
FIGS. 5(A)-(D) are views showing steps of manufacturing a first substrate according to the embodiment.

(3) By performing electrolytic plating, electrolytic plated film 135 is formed on electroless plated film 131 and in via openings 133 (FIG. 5(A)).

Figure 5B:
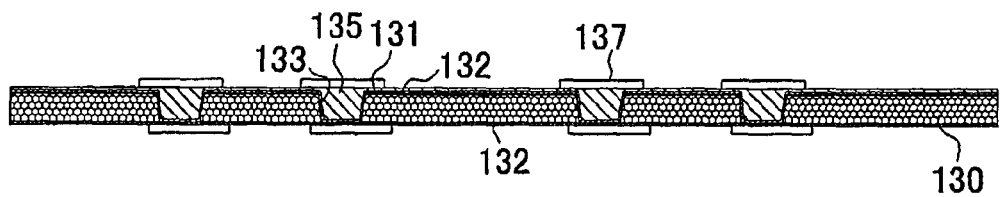
Figure 5C:
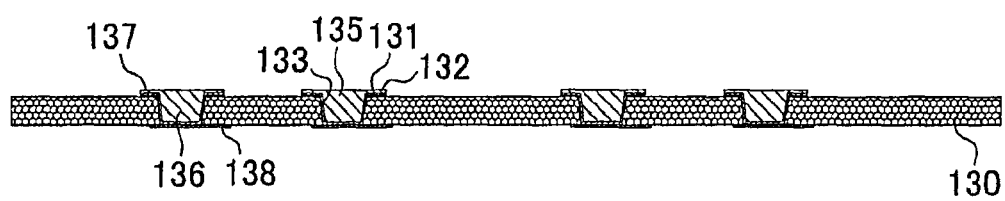
Figure 5D:
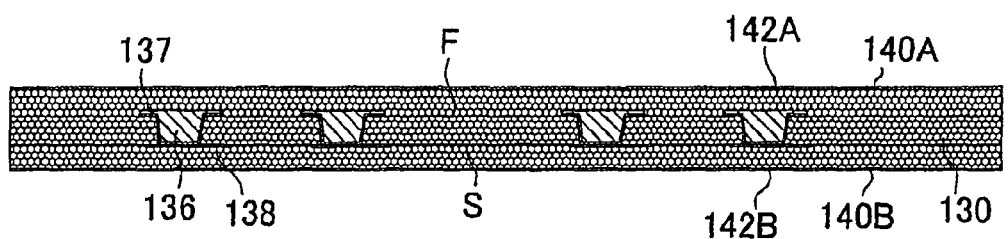

(4) Etching resist 137 is formed in portions where first conductors are to be formed (FIG. 5(B)).

(5) Electrolytic plated film 135, electroless plated film 131 and copper foil 132 in portions where resist 137 is not formed are dissolved by etching, and resist 137 is removed. Accordingly, via conductors 136 and first conductors (137, 138) are formed (FIG. 5(C)). After that, first conductors are roughened (not shown in the drawing).

(6) Prepreg having copper foil (142A) only on one surface is laminated to form insulation layer (140A) on first surface (F) of insulation layer 130. Also, prepreg having copper foil (142B) only on one surface is laminated on second surface (S) to form insulation layer (140B) on second surface (S) of insulation layer 130 (FIG. 5(D)).

Figure 6A:
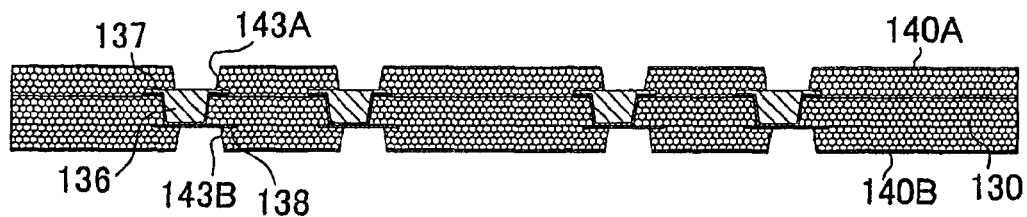
FIGS. 6(A)-(D) are views showing steps of manufacturing a first substrate according to the embodiment.
Figure 6B:
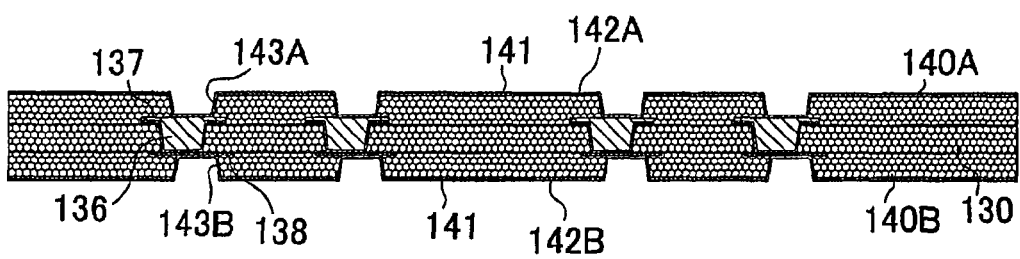

(7) Using a laser, penetrating holes (143A) for via conductors are formed in insulation layer (140A) and penetrating holes (143B) for via conductors are formed in insulation layer (140B) (FIG. 6(A)). Then, by performing electroless plating, electroless plated film 141 is formed (FIG. 6(B)).

Figure 6C:
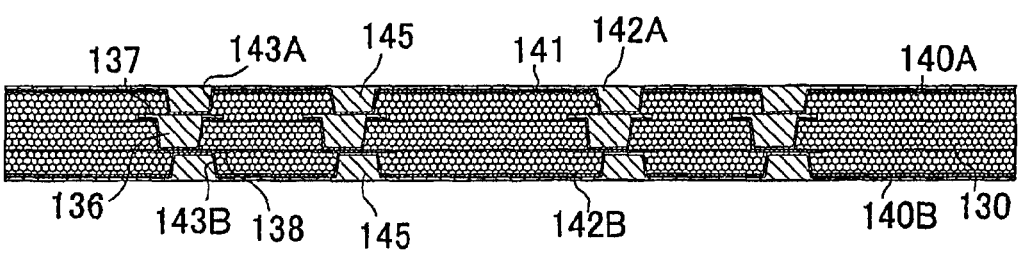

(8) By performing electrolytic plating, electrolytic plated film 145 is formed on electroless plated film 141 and in penetrating holes (143A, 143B) (FIG. 6(C)).

Figure 6D:
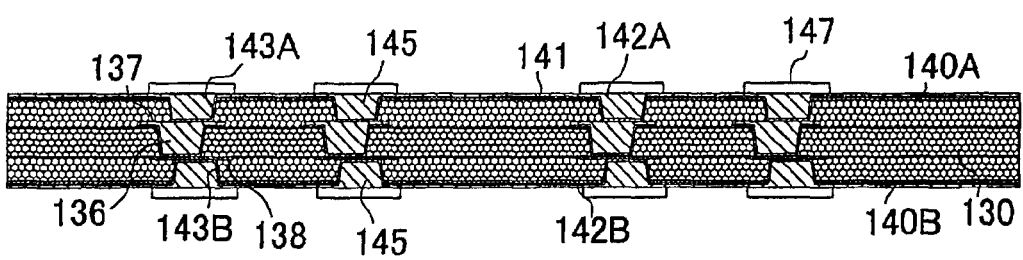

(9) Etching resist 147 is formed in portions where first conductors are to be formed (FIG. 6(D)).

(10) Electrolytic plated film 145, electroless plated film 141 and copper foils (142A, 142B) in portions where resist 147 is not formed are dissolved by etching, and resist 147 is removed. Accordingly, via conductors (146A, 146B) and first conductors (147, 148) are formed (FIG. 7(C)). After that, first conductors (147, 148) are roughened (not shown in the drawing).

Figure 7A:
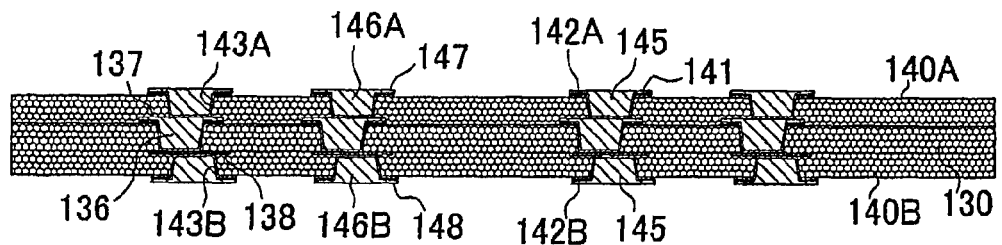
FIGS. 7(A)-(D) are views showing steps of manufacturing a first substrate according to the embodiment.
Figure 7B:
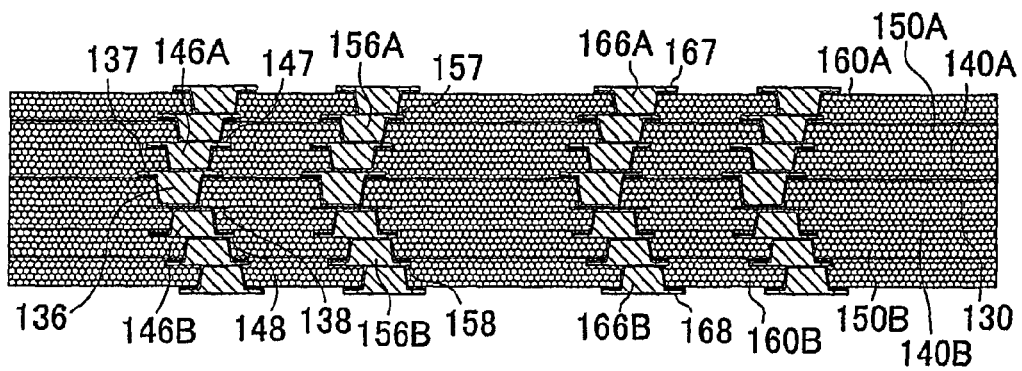

(11) Above-described steps (6) through (10) are repeated (FIG. 7(B)).

Figure 7C:
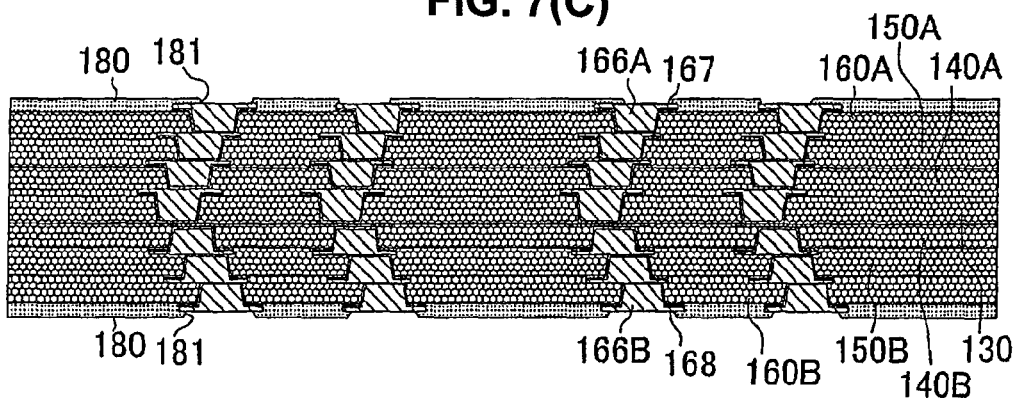

(12) Solder-resist layers 180 having openings 181 and with an approximate thickness of 20 μm are formed (FIG. 7(C)).

Figure 7D:
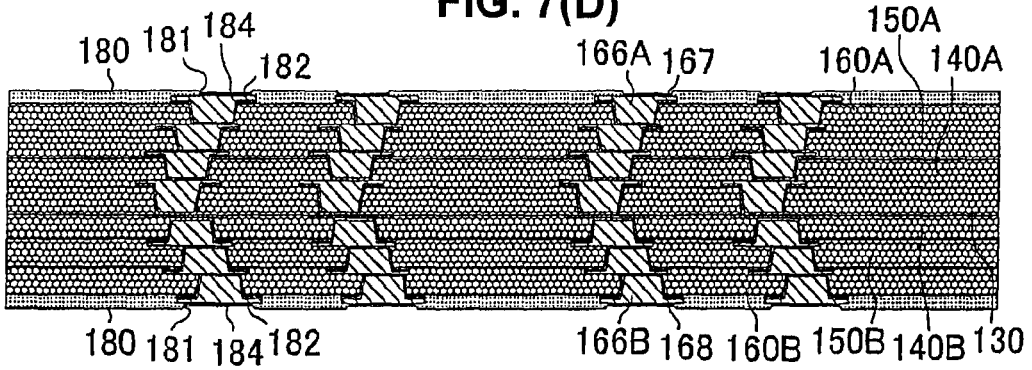

(13) Nickel-plated layer 182 is formed in openings 181 of solder-resist layers 180 and gold-plated layer 184 is formed (FIG. 7(D)). Other than nickel-gold layers, nickel-palladium-gold layers may also be formed.

(14) Solder balls are loaded in openings 181 and a reflow is conducted at a predetermined temperature to form solder bumps 186 (FIG. 2).

Second Substrate

Figure 8:
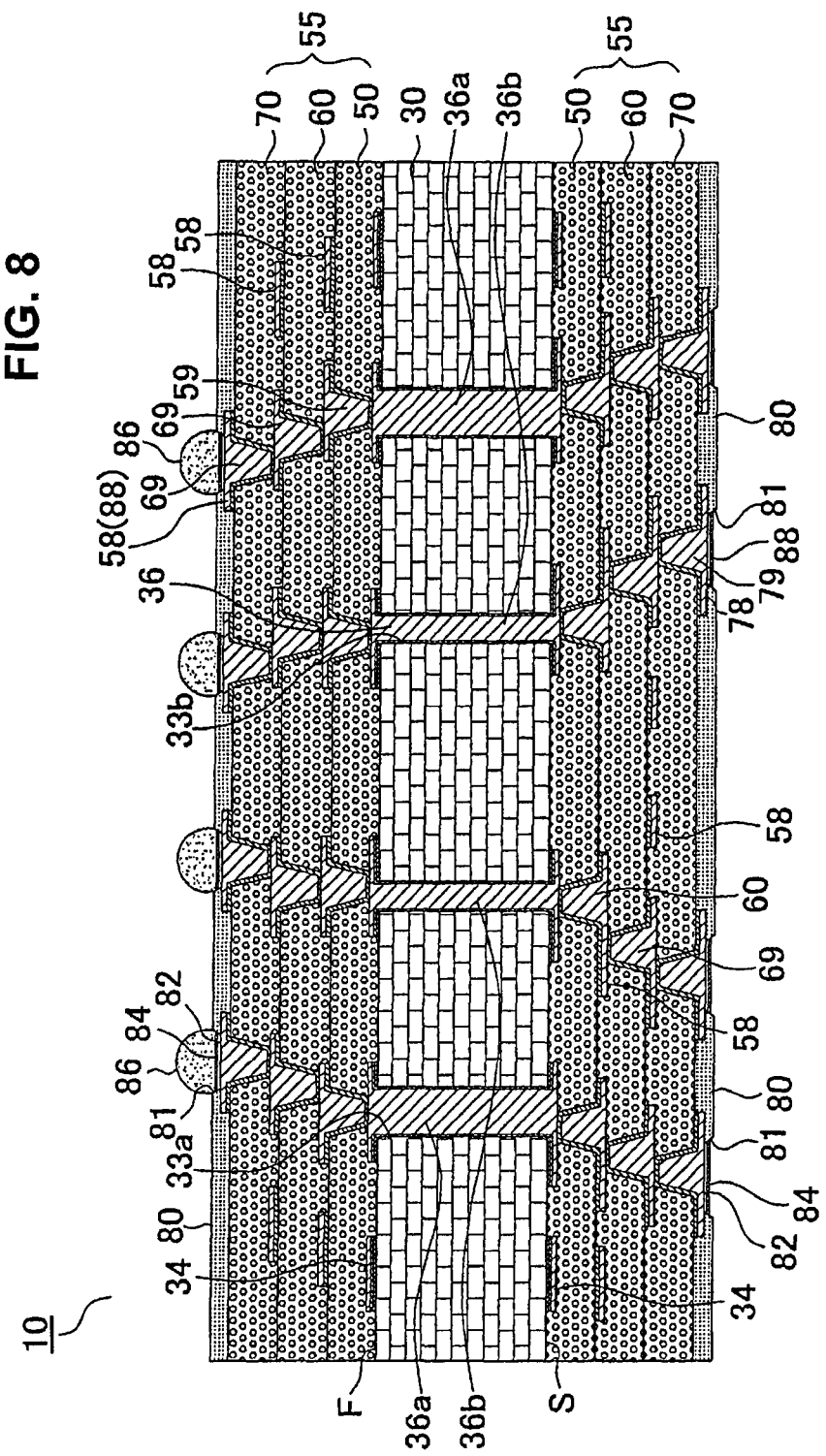
FIG. 8 is a cross-sectional view of a second substrate according to the embodiment.

FIG. 8 is a cross-sectional view of second substrate 10. In approximately the center of a thickness direction, second substrate 10 has core substrate 30 having first surface (F) and second surface (S). Second conductors 34 are formed on first surface (F) and second surface (S) of core substrate 30.

Penetrating holes (33a, 33b) are formed in core substrate 30. Those penetrating holes have different diameters. In the present embodiment, there are first penetrating holes (33b) with a diameter of 180 μm and second penetrating holes (33a) with a diameter of 250 μm. In those penetrating holes, through-hole conductors are formed for connecting second conductors 34 to each other. Among those through-hole conductors, those formed in first penetrating holes with a greater diameter are first through-hole conductors (36a), and those formed in second penetrating holes with a smaller diameter are second through-hole conductors (36b).

First through-hole conductors (36a) are signal conductors, and second through-hole conductors (36b) are power-supply or ground conductors. However, electrical functions of through-hole conductors (36a, 36b) are not limited to the above.

On first surface (F) and second surface (S) of core substrate 30, buildup layers 55 are each formed by alternately laminating interlayer resin insulation layers 50 and third conductors 58. Then, second conductors 34 and third conductors 58 are connected through via conductors 59, and third conductors 58 positioned in different layers are electrically connected to each other through via conductors 69. Solder-resist layers 80 having openings are formed on outermost interlayer resin insulation layers 70. Solder bumps 86 for mounting a semiconductor element are formed in openings of solder-resist layer 80 on the first-surface side.

Figure 9A:
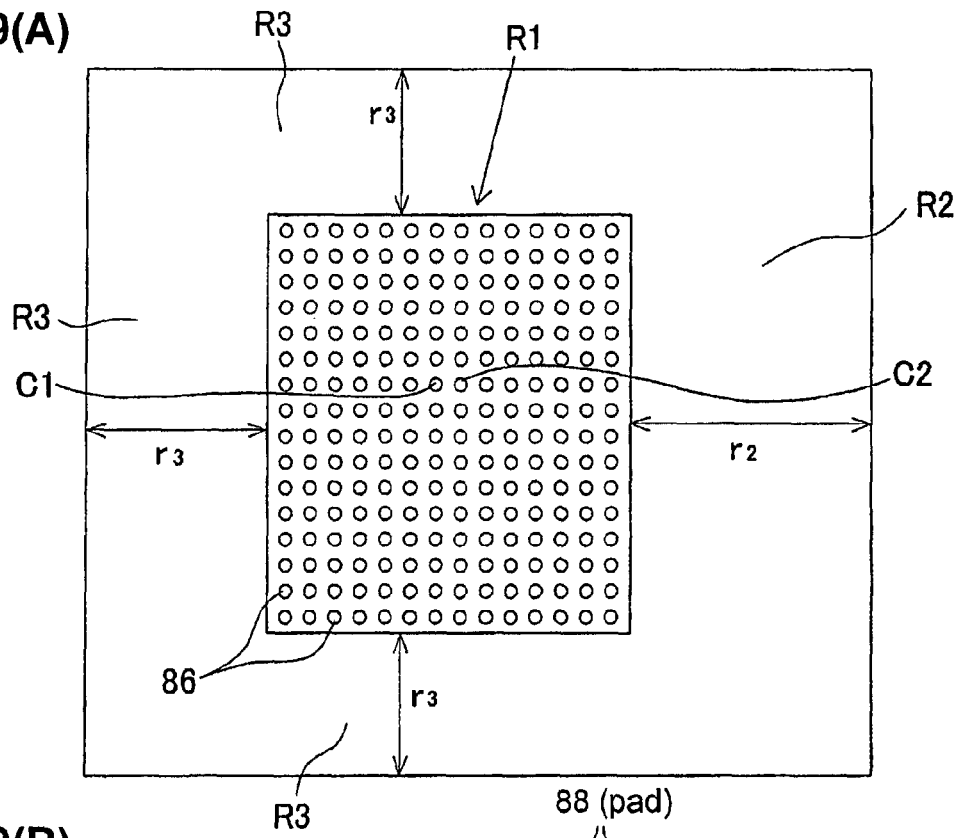
FIGS. 9(A)-(B) is a plan view of a second substrate according to the embodiment.

FIG. 9(A) is a plan view of the first surface of second substrate 10 (the surface on which a semiconductor element is mounted). Second substrate 10 is shaped to be substantially rectangular, and has semiconductor element mounting region (R1) in which second bumps 86 are formed. Center (C1) of semiconductor element mounting region (R1) is shifted from center (C2) of the first surface of second substrate 10. Namely, in the periphery of semiconductor element mounting region (R1), there is region (R2) which is wider than the rest. Region (R2) is positioned in a direction opposite the direction that heads from center (C2) of second substrate 10 toward center (C1) of semiconductor element mounting region (R1). Of the entire peripheral region of semiconductor element mounting region (R1), when the regions along three sides excluding region (R2) are each referred to as (R3), and when the width of region (R2) is set as (r2) and the width of regions (R3) is set as (r3), r2>r3 is satisfied.

After resin filler has been applied on wider region (R2), resin filler is poured among multiple bumps 86 that form semiconductor element mounting region (R1) and along the region's periphery. Accordingly, voids are effectively suppressed from occurring in the resin filler that exists between semiconductor element mounting region (R1) and a semiconductor element to be mounted on the region.

Also, in regions (R3) along the other three sides of the entire periphery of semiconductor element mounting region (R1), since the width is relatively narrow, resin filler tends not to flow smoothly along those three sides. Therefore, resin filler easily circulates among multiple bumps that form semiconductor element mounting region (R1).

Figure 9B:
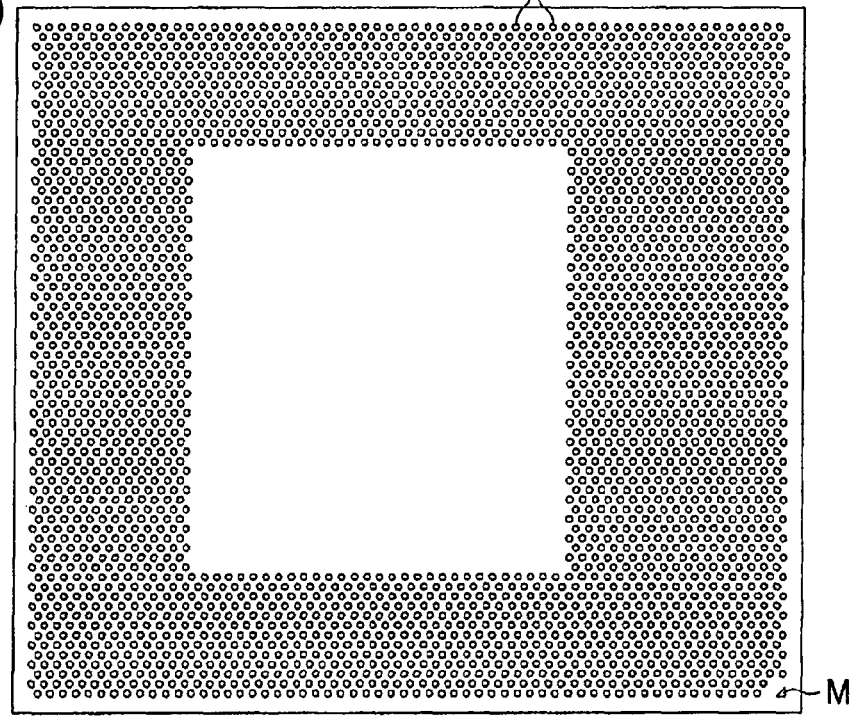

As shown in FIG. 9(B), the lower surface (second surface) of second substrate 10 has a pad array formed by pads 88 that correspond to the bump array of above first substrate 110. Of the entire array, a triangular indication mark (M) is formed in a portion that corresponds to corner (C) of first substrate 110. The purpose of indication mark (M) is to align first substrate 110 and second substrate 10 when both are connected.

In the following, a method for manufacturing second substrate 10 is described with reference to FIGS. 10 through 13.

Figure 10A:
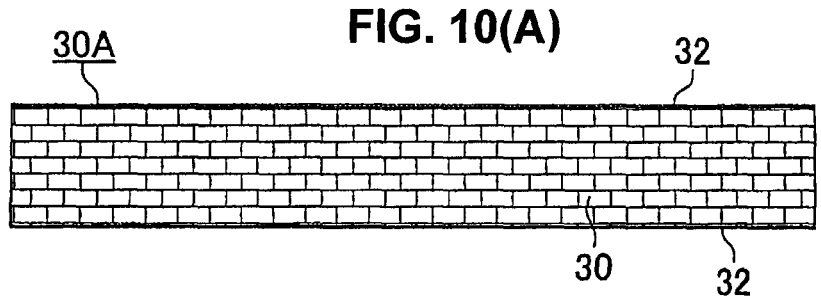
FIGS. 10(A)-(E) are views showing steps of manufacturing a second substrate according to the embodiment.

(1) Copper-clad laminate (30A), made by laminating copper foil 32 on both surfaces of insulative substrate 30 which is either glass-epoxy resin or BT (bismaleimide triazine) resin with a thickness of 0.2~0.8 mm, is used as a starting material (FIG. 10(A)).

Figure 10B:
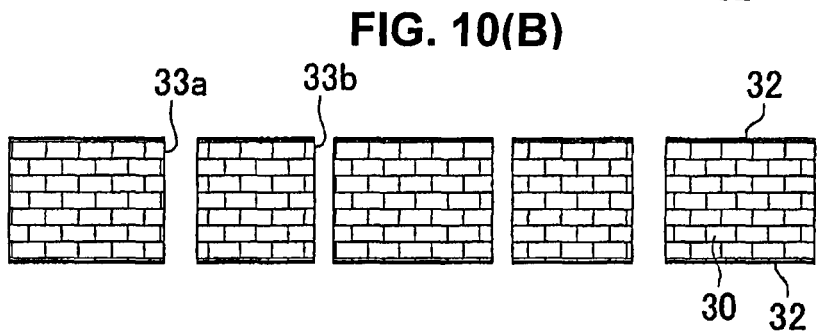
Figure 10C:
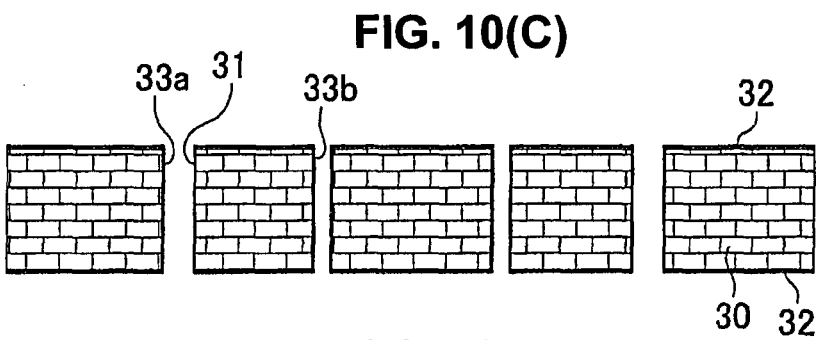

(2) First, penetrating holes 33 for through holes are formed in the copper-clad laminate using a drill or a laser (FIG. 10(B)). Then, by performing electroless plating, electroless plated film 31 is formed (FIG. 10(C)). During that time, two kinds of penetrating holes with different diameters, penetrating holes (33b) (for example, 180 μm) and penetrating holes (33a) (for example, 250 μm), are formed.

Figure 10D:
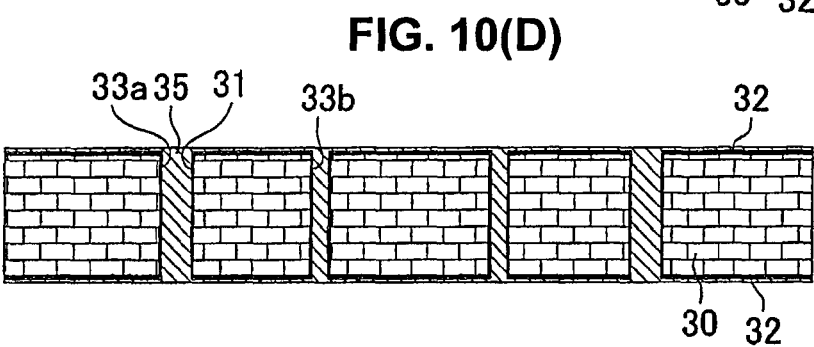

(3) By performing electrolytic plating, electrolytic plated film 35 is formed on plated film 31 and in penetrating holes 33 for through holes (FIG. 10(D)). Then, filling resin is filled in spaces formed by electrolytic plated film 35. Here, the process to fill filling resin may be omitted, and electrolytic plated film may be filled in penetrating holes 33 for through holes.

Figure 10E:
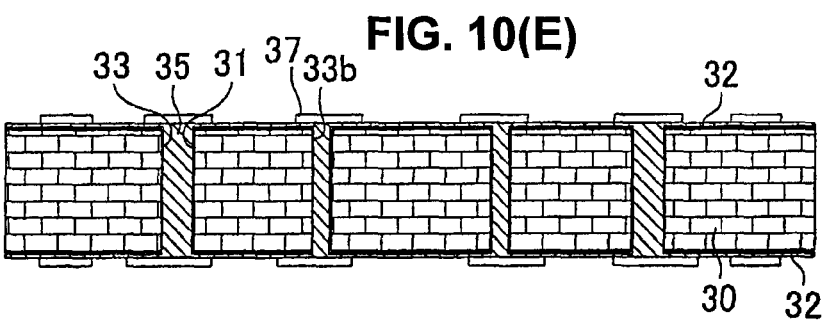

(4) Etching resist 37 is formed in portions where second conductors are to be formed (FIG. 10(E)).

(5) Electrolytic plated film 35, electroless plated film 31 and copper foil 32 in portions where resist 37 is not formed are dissolved by etching, and resist 37 is removed. Accordingly, through-hole conductors (36a, 36b) and second conductors 34 are formed (FIG. 11(A)). After that, second conductors 34 are roughened (not shown in the drawing).

(6) On both surfaces of core substrate 30 after the above steps, resin film for interlayer resin insulation layers (brand name: ABF-45SH, made by Ajinomoto) with an approximate thickness of 25 μm is laminated by vacuum pressing while temperatures are raised to 50~150° C. Accordingly, interlayer resin insulation layers 50 are formed (FIG. 11(B)).

Figure 11A:
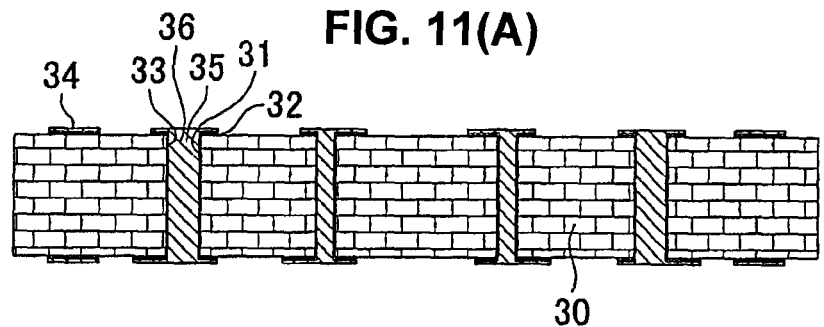
FIGS. 11(A)-(D) are views showing steps of manufacturing a second substrate according to the embodiment.
Figure 11B:
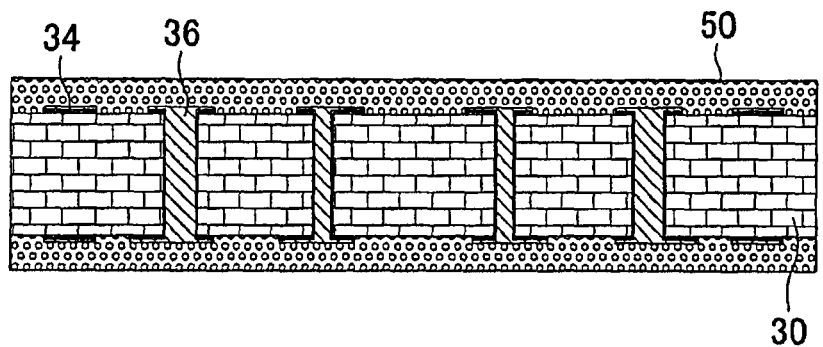
Figure 11C:
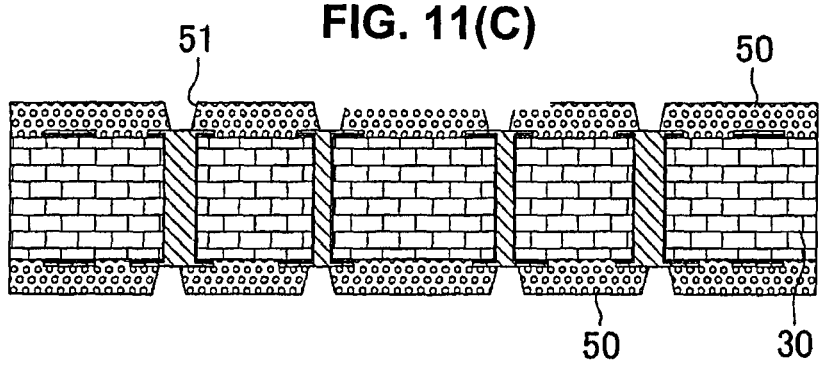

(7) Next, using a CO2 gas laser, openings 51 for via holes with an approximate diameter of 60 μm are formed in interlayer resin insulation layers 50 (FIG. 11(C)). By immersing the substrate in an oxidation agent containing chromic acid, permanganate or the like, surfaces of interlayer resin insulation layers 50 are roughened (not shown in the drawings).

Figure 11D:
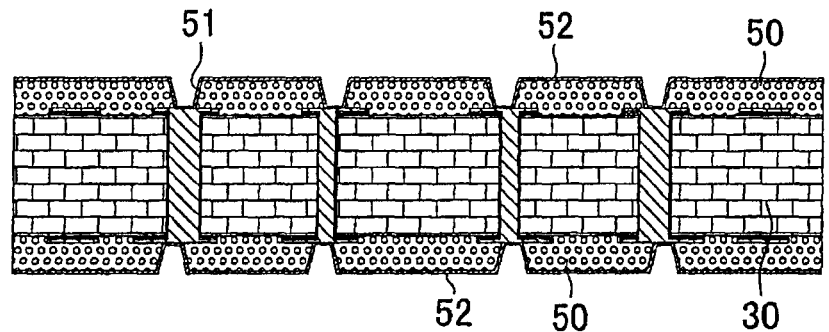

(8) By applying a catalyst such as palladium in advance on the surface layers of interlayer resin insulation layers 50 and through immersion in an electroless plating solution for 5~60 minutes, electroless plated film 52 is formed in a range of 0.1~5 μm (FIG. 11(D)).

(9) After the above procedure is finished, a commercially available photosensitive dry film is laminated on substrate 30, a photomask is placed, and the film is exposed to light and developed using sodium carbonate. Accordingly, 15 μm-thick plating resist 54 is formed (see FIG. 12(A)).

Figure 12A:
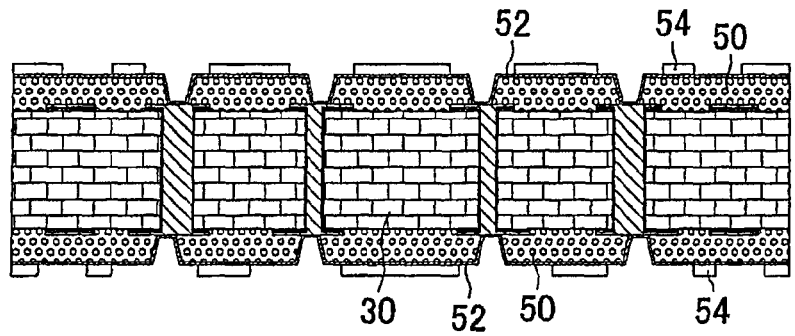
FIGS. 12(A)-(D) are views showing steps of manufacturing a second substrate according to the embodiment.
Figure 12B:
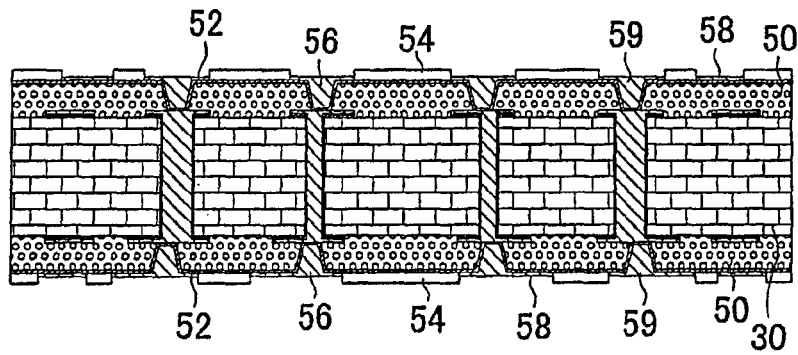
Figure 12C:
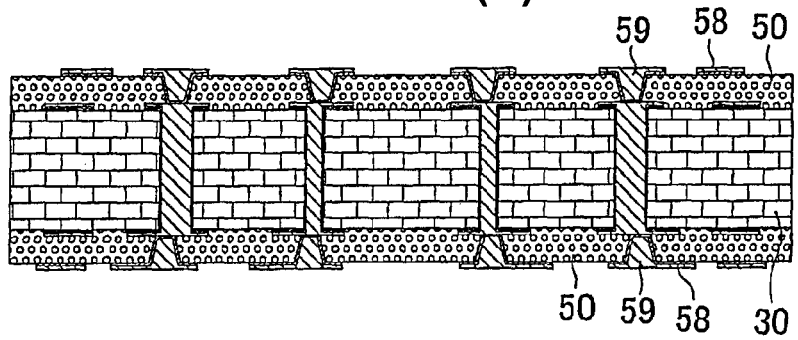

(10) Next, by performing electrolytic plating, 15 μm-thick electrolytic plated film 56 is formed (FIG. 12(B)).

(11) After plating resist 54 is removed using an amine solution, electroless plated film 52 under the plating resist is removed by etching using a mixed solution of sulfuric acid and hydrogen peroxide. Accordingly, second conductors 58 with an approximate thickness of 15 μm and via conductors 59 are formed, being made of electroless plated film 52 and electrolytic plated film 56 (FIG. 12(C)). Surfaces of third conductors 58 and via conductors 59 are roughened using an etching solution containing a copper (II) complex and organic acid (not shown in the drawings).

Figure 12D:
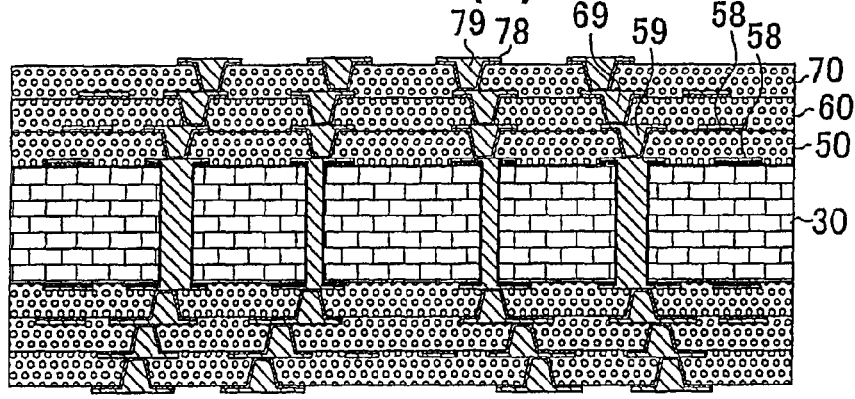

(12) Taking the same steps as above (6) through (11), the following are formed: interlayer resin insulation layers 60 where via conductors 69 and second conductors 68 are formed, and interlayer resin insulation layers 70 where via conductors 79 and third conductors 58 are formed (FIG. 12(D)).

(13) After applying a commercially available solder-resist composition to be 20 µm thick on both surfaces of the substrate, the composition is dried. Then, a 5-mm thick photomask with a pattern corresponding to solder-resist opening portions is adhered to the solder resist layers, which are then exposed to ultraviolet rays and developed with a DMTG solution. Accordingly, openings 81 with a smaller diameter are formed in the upper-surface side and openings 81 with a greater diameter are formed on the lower-surface side. Moreover, solder-resist layers are cured through thermal treatment, and solder-resist pattern layers 80 having openings 81 and with an approximate thickness of 20 µm are obtained (FIG. 13(A)).

(14) Next, the substrate with solder-resist layers 80 is immersed in an electroless nickel plating solution, and nickel-plated layer 82 with a thickness of 5 µm is formed in openings 81. Moreover, the substrate is immersed in an electroless gold plating solution, and gold-plated layer 84 with a thickness of 0.03 µm is formed on nickel-plated layer 82 (FIG. 13(B)). Other than nickel-gold layers, nickel-palladium-gold layers may be formed.

(15) A mask with openings is placed by making an alignment with openings 81 of the substrate, and solder balls (86a) are loaded in openings 81 (FIG. 13(C)).

(16) Through a reflow process at approximately 200° C., solder balls (86a) are made into solder bumps 86. Accordingly, second substrate 10 is completed (FIG. 8).

Method for Manufacturing Semiconductor Mounting Device

Connecting second substrate 10 and first substrate 110 is described with reference to FIG. 14.

Figure 14A:
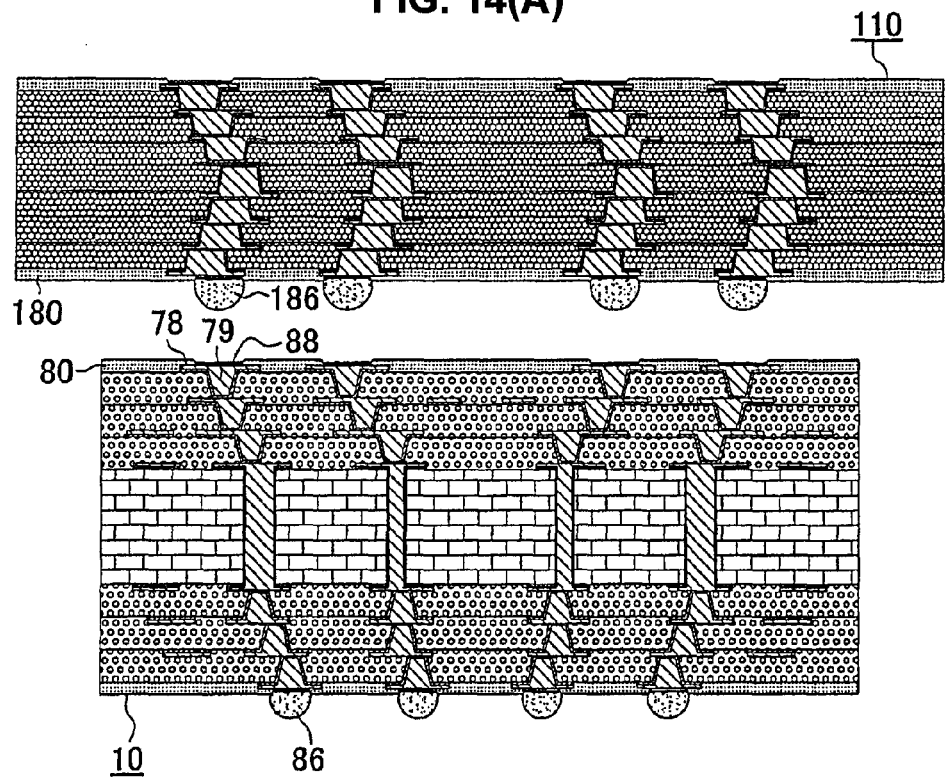
FIGS. 14(A)-(B) are views showing steps of manufacturing a semiconductor mounting device according to the embodiment.
Figure 14B:
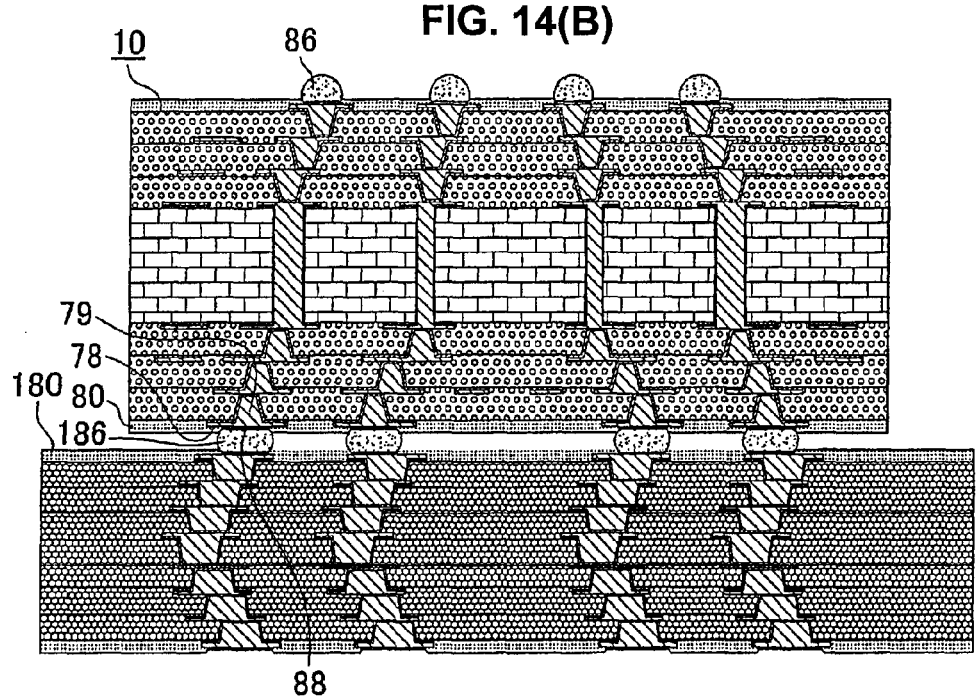
Figure 15:
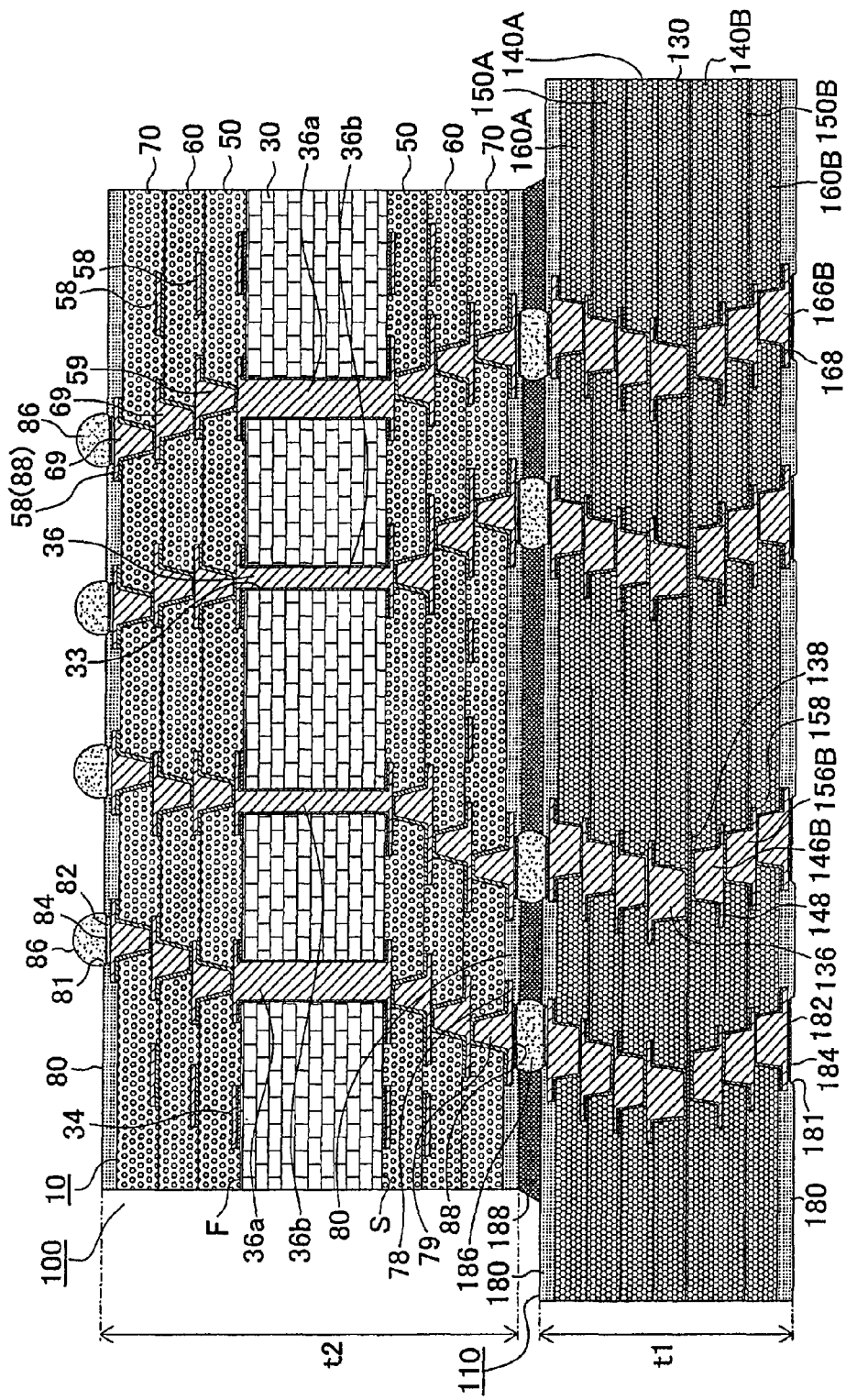
FIG. 15 is a cross-sectional view of a semiconductor mounting device according to the embodiment.

As shown in FIG. 14(A), second substrate 10 is inversed so that solder bumps 76 are positioned on the lower side. Then, first substrate 110 is adsorbed using an adsorber, which is not shown in the drawing, and is aligned so that positions of solder bumps 186 of first substrate 110 correspond to those of pads 88 of second substrate 10. Then, a reflow is conducted at approximately 200° C. while solder bumps 186 are in contact with pads 88, and second substrate 10 and first substrate 110 are connected as shown in FIG. 14(B).

Next, resin filler 188 is filled between first substrate 110 and second substrate 10, and semiconductor mounting device 100 is completed (FIG. 15).

Next, semiconductor element 200 is mounted via solder bumps 86, and resin filler 288 is filled between semiconductor element 200 and second substrate 10 (FIG. 1). Here, the same resin filler 288 is filled between first substrate 110 and second substrate 10, as well as between semiconductor element 200 and second substrate 10. By doing so, reliability such as that required when mounting a semiconductor element is easily ensured, and cracks are suppressed from occurring in bumps 186.

In the present embodiment, semiconductor mounting device 100 is structured with two printed wiring boards; first substrate 110 and second substrate 10. Therefore, compared with increasing the number of layers in a buildup wiring board for the purpose of responding to the demand for multilayer wiring and enhanced power supply, productivity does not decrease.

Also, in the present embodiment, bumps are formed only on one surface of second substrate 10, and the bumps to contribute to the connection of both substrates are formed on the first-substrate 110 side. Usually, second substrate 10 takes a longer manufacturing time than first substrate 110, and its productivity is low. Thus, if bumps are formed on both surfaces of second substrate 10, its productivity is further reduced because of that process. Therefore, by forming the bumps that contribute to the connection of both substrates on the first-substrate 110 side, the productivity of second substrate 10 increases, leading to enhanced productivity of the mounting device.

Moreover, in the present embodiment, first substrate 110 is mounted on second substrate 10 positioned on the lower side. If second substrate 10 is mounted using an adsorber onto first substrate 110 positioned on the lower side, the first surface of second substrate 10 (the surface where bumps 86 are formed) is the adsorption surface. In such a case, bumps 86 may be damaged during the mounting process due to the interaction with the adsorber. By contrast, in the present embodiment, among the surfaces of first substrate 110, bumps are not formed on the surface with which the adsorber makes contact. Therefore, there is no concern of damaging bumps when both substrates are connected.

In addition, the thickness of second substrate 10 is greater than that of first substrate 110. In such a case, it is thought that stress generated during the process of mounting a semiconductor element is mitigated in relatively thick second substrate 10 before such stress spreads to the bumps positioned between first substrate 110 and second substrate 10. As a result, connection reliability is easily ensured between first substrate 110 and second substrate 10.

A semiconductor mounting device according to an embodiment of the present invention is characterized to have the following: a first substrate which has multiple first insulation layers having penetrating holes, first conductors formed on the first insulation layers, and via conductors formed in the penetrating holes and connecting the first conductors to each other; a second substrate which has a core substrate having a penetrating hole, second conductors formed on both surfaces of the core substrate, a through-hole conductor formed in the penetrating hole and connecting the second conductors to each other, and buildup layers formed on the core substrate and on the second conductors by alternately laminating second insulation layers and third conductors; a first bump formed on a first conductor positioned on the outermost layer among the first conductors and connecting the first substrate and the second substrate; and a second bump formed on a third conductor positioned on the outermost layer among the third conductors and for connection with a semiconductor element. In such a semiconductor mounting device, the thickness of the second substrate is greater than that of the first substrate.

Such a semiconductor mounting device has a first substrate and a second substrate which is formed on the first substrate via bumps. Namely, in the semiconductor mounting device, a conventional wiring board with multilayer wiring and of great size is divided at least into two members while reducing the number of layers in each member, and then the members are connected to each other through bumps. Accordingly, compared with a conventional wiring board having multilayer wiring and great size, productivity is improved.

Since semiconductor mounting device 100 is formed with two printed wiring boards such as second substrate 10 and first substrate 110, productivity does not decrease as opposed to a buildup substrate which is set to have a greater number of layers and greater size for the purpose of responding to the demand for multilayer wiring and enhanced power supply. By combining a buildup substrate with a longer manufacturing time and a laminated substrate with a shorter manufacturing time, the entire manufacturing time is shortened.

In addition, the thickness of the second substrate is greater than that of the first substrate. In such a case, it is thought that stress generated during the process of mounting a semiconductor element on the second substrate is mitigated inside the relatively thick second substrate before the stress spreads to the bumps existing between the first substrate and the second substrate. As a result, connection reliability is easily ensured between the first substrate and the second substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor mounting device, comprising:
a first substrate comprising a plurality of insulation layers, a plurality of conductor layers formed on the insulation layers, and a plurality of via conductors connecting the conductor layers;
a second substrate comprising a plurality of insulation layers and a plurality of conductor layers formed on the insulation layers of the second substrate;
a plurality of first bumps connecting the first substrate and the second substrate and formed on an outermost conductor layer of the first substrate formed on an outermost insulation layer of the first substrate;
a plurality of second bumps positioned to mount a semiconductor element to the second substrate and formed on an outermost conductor layer of the second substrate formed on an outermost insulation layer of the second substrate;
a solder resist layer formed on the outermost conductor layer and the outermost insulation layer of the first substrate such that the solder resist layer has a plurality of opening portions forming a plurality of exposed portions of the outermost conductor layer of the first substrate; and
a plurality of metal layers formed on the exposed portions of the outermost conductor layer of the first substrate, respectively,
wherein the second substrate has a thickness which is greater than a thickness of the first substrate.

2. The semiconductor mounting device according to claim 1, wherein the first substrate and the second substrate satisfy $1<t2/t1<2$, where the thickness of the first substrate is set as t1 and the thickness of the second substrate is set as t2.

3. The semiconductor mounting device according to claim 2, wherein the plurality of first bumps is positioned in a peripheral array.

4. The semiconductor mounting device according to claim 3, wherein the plurality of first bumps has a plurality of layout regions forming four sides, and the plurality of layout regions includes a first layout region having a width which is greater than a width of a second layout region facing the first layout region.

5. The semiconductor mounting device according to claim 1, further comprising:
the semiconductor element connected to the second bumps such that the semiconductor element is mounted on the second substrate;
a first resin filler filling a space formed between the first substrate and the second substrate; and
a second resin filler filling a space formed between the second substrate and the semiconductor element and comprising a same resin material as the first resin filler.

6. The semiconductor mounting device according to claim 1, wherein the plurality of first bumps is positioned in a peripheral array.

7. The semiconductor mounting device according to claim 6, wherein the plurality of first bumps has a plurality of layout regions forming four sides, and the plurality of layout regions includes a first layout region having a width which is greater than a width of a second layout region facing the first layout region.

8. The semiconductor mounting device according to claim 1, wherein each of the via conductors in the first substrate comprises plating material filling a hole in one of the insulation layers in the first substrate.

9. The semiconductor mounting device according to claim 1, wherein the via conductors in the first substrate are stacked such that the via conductors form a plurality of columnar structures.

10. The semiconductor mounting device according to claim 1, wherein the plurality of first bumps is positioned in a peripheral array, the plurality of first bumps has a plurality of layout regions forming four sides, and the plurality of layout regions includes a layout region having a width which is greater than widths of the other layout regions.

11. The semiconductor mounting device according to claim 1, wherein the plurality of first bumps is positioned in a peripheral array, and the plurality of first bumps has layout regions forming a plurality of sides and includes a plurality of bumps positioned along an oblique line at at least one corner of the layout regions.

12. The semiconductor mounting device according to claim 1, wherein the plurality of first bumps is positioned in a peripheral array, and the plurality of first bumps has a plurality of layout regions forming four sides and includes a plurality of bumps positioned along an oblique line at at least one corner of the layout regions.

13. The semiconductor mounting device according to claim 1,
wherein each of the metal layers comprises a nickel layer, a palladium layer and a gold layer.

14. The semiconductor mounting device according to claim 1, wherein the second substrate has a semiconductor mounting region in which the semiconductor element is mounted such that the semiconductor mounting region is surrounded by a plurality of peripheral regions and that the plurality of peripheral regions includes one peripheral region having a width which is greater than widths of the other peripheral regions.

15. The semiconductor mounting device according to claim 1, wherein the first substrate has a plurality of corner portions, and the first substrate includes a triangular indication mark in one of the corner portions.

16. A method for manufacturing a semiconductor mounting device, comprising:
forming a plurality of first bumps on a first substrate;
forming a plurality of second bumps positioned to mount a semiconductor element on a surface of a second substrate; and
connecting the first substrate and the second substrate via the first bumps,
wherein the first substrate has a plurality of insulation layers, a plurality of conductor layers formed on the insulation layers, and a plurality of via conductors connecting the conductor layers, the second substrate has a plurality of insulation layers and a plurality of conductor layers formed on the insulation layers of the second substrate, the plurality of first bumps is formed on an outermost conductor layer of the first substrate, the plurality of second bumps is formed on an outermost conductor layer of the second substrate, and the second substrate has a thickness which is greater than a thickness of the first substrate.

17. The method for manufacturing a semiconductor mounting device according to claim 16, wherein the first substrate and the second substrate satisfy 1<t2/t1<2, where the thickness of the first substrate is set as t1 and the thickness of the second substrate is set as t2.

18. The method for manufacturing a semiconductor mounting device according to claim 16, wherein the forming of the plurality of first bumps comprises positioning the plurality of first bumps in a peripheral array.

19. The method for manufacturing a semiconductor mounting device according to claim 16, wherein the plurality of first bumps is positioned in a peripheral array, the plurality of first bumps is formed to have a plurality of layout regions forming four sides, and the plurality of layout regions includes a layout region having a width which is greater than widths of the other layout regions.

20. The method for manufacturing a semiconductor mounting device according to claim 16, further comprising:
   forming a solder resist layer on the outermost conductor layer and the outermost insulation layer of the first substrate such that the solder resist layer has a plurality of opening portions forming a plurality of exposed portions of the outermost conductor layer of the first substrate; and
   forming a plurality of metal layers on the exposed portions of the outermost conductor layer of the first substrate, respectively.

* * * * *